United States Patent [19]
Banerjee et al.

[11] Patent Number: 5,811,880
[45] Date of Patent: Sep. 22, 1998

[54] DESIGN FOR MOUNTING DISCRETE COMPONENTS INSIDE AN INTEGRATED CIRCUIT PACKAGE FOR FREQUENCY GOVERNING OF MICROPROCESSORS

[75] Inventors: Koushik Banerjee; Barbara Jane Ultis, both of Chandler; Sanjay Gupta, Tempe; John F. McMahon, Phoenix, all of Ariz.

[73] Assignee: Intel Corporation, Santa Clara, Calif.

[21] Appl. No.: 954,984

[22] Filed: Oct. 21, 1997

Related U.S. Application Data

[63] Continuation of Ser. No. 623,301, Mar. 28, 1996, abandoned.

[51] Int. Cl.⁶ .......................... H01L 23/34; H01L 23/48; H01L 23/02
[52] U.S. Cl. .......................... 257/724; 257/693; 257/697; 257/924
[58] Field of Search .................... 257/723.4, 698, 257/924, 693, 697, 724, 780, 678

[56] References Cited

U.S. PATENT DOCUMENTS 5,103,283  4/1992  Hite .......................... 257/724
5,237,204  8/1993  Vac .......................... 257/724

FOREIGN PATENT DOCUMENTS

| 59-222948 | 12/1984 | Japan | 257/724 |
| 62-290159 | 12/1987 | Japan | 257/924 |
| 62-291128 | 12/1987 | Japan | 257/724 |
| 63-032954 | 2/1988 | Japan | 257/724 |
| 63-173347 | 7/1988 | Japan | 257/723 |
| 4-245467 | 9/1992 | Japan | 257/924 |

Primary Examiner—Mahshid D. Saadat
Assistant Examiner—Teresa M. Arroyo
Attorney, Agent, or Firm—Blakely, Sokoloff, Taylor & Zafman

[57] ABSTRACT

An electronic package which contains discrete resistive and capacitive components used to control the operating device of an integrated circuit located within the package. The package has a bonding shelf that has a plurality of bond fingers which are connected to the integrated circuit. The discrete passive components are mounted to the bonding shelf and connected to the bond fingers by lead traces. The lead traces terminate at the discrete devices so that the resistor and capacitor cannot be accessed through the external contacts of the package. The integrated circuit and discrete components are typically enclosed by a molded plastic material to prevent physical access to the devices without damaging the package.

8 Claims, 1 Drawing Sheet ic
DESIGN FOR MOUNTING DISCRETE COMPONENTS INSIDE AN INTEGRATED CIRCUIT PACKAGE FOR FREQUENCY GOVERNING OF MICROPROCESSORS This is a Continuation Application of application Ser. No. 08/623,301, filed Mar. 28,1996, now abandoned.

BACKGROUND OF THE INVENTION

1. Field of the Invention

The present invention relates to a package for an integrated circuit.

2. Description of Related Art

Integrated circuits such as microprocessors are typically housed within a package that is soldered to a printed circuit board. Microprocessors are manufactured at different operating speeds. For example, there are commercially available microprocessors that operate at 50 megahertz (MHz), 66 MHz, 100 MHz, etc. The packages are typically marked with an indicia which indicates the operating speed of the microprocessor.

It has been found that third parties will modify existing microprocessors to operate at a higher frequency and then remark the packages for further distribution and sale. Such activity may dilute the goodwill of the original manufacturer of the processor, particularly if the device does not fully perform at the modified speed. It would be desirable to provide a package which contains a timing device that cannot be removed, destroyed, or modified without damaging the package to the extent that resale is not feasible.

SUMMARY OF THE INVENTION

The present invention is an electronic package which contains discrete resistive and capacitive components used to control the operating speed of an integrated circuit located within the package. The package contains a bond shelf that has a plurality of bond fingers which are connected to the integrated circuit. The discrete passive components are mounted to the bond shelf and connected to the bond fingers by lead traces. The lead traces terminate at the discrete devices so that the resistor and capacitor cannot be accessed through the external contacts of the package. The integrated circuit and discrete components are typically enclosed by a molded plastic material to prevent physical access to the devices without damaging the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
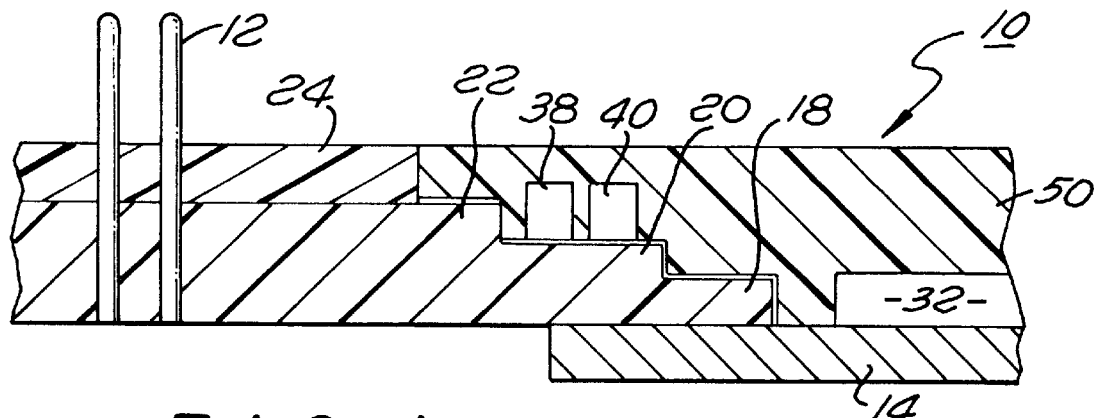
FIG. 1 is a side cross-sectional view of an electronic package of the present invention.
Figure 2:
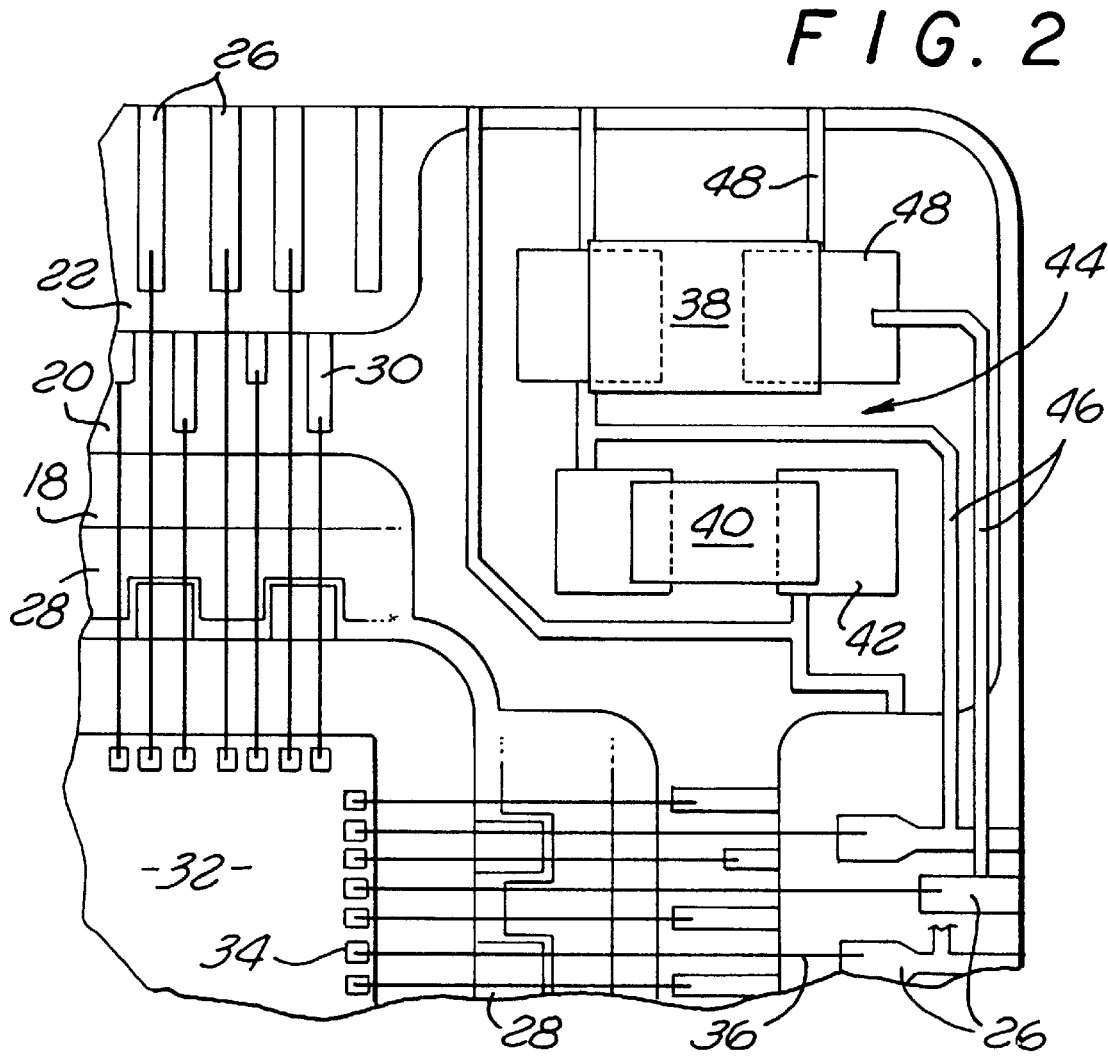
FIG. 2 is an enlarged top sectional view of the electronic package showing a resistor and a capacitor mounted to a recess within a bond shelf.

Referring to the drawings more particularly by reference numbers, FIGS. 1 and 2 show an electronic package 10 of the present invention. The package 10 has a plurality of pins 12 that can be coupled to an external printed circuit board either directly or through a socket (not shown). Although a pin grid array (PGA) package is shown and described, it is to be understood that the package may include a land grid array (LGA), a ball grid array (BGA), or any other type of package interconnect.

The package 10 preferably has a heat slug 14 that is attached to a substrate 16. The heat slug 14 is preferably constructed from a thermally conductive material such as nickel plated copper to more efficiently remove heat from the package 10. Although a heat slug 14 is shown and described, it is to be understood that the package 10 may be constructed without a heat slug 14.

The substrate 16 preferably has a first bond shelf 18, a second bond shelf 20, a third bond shelf 22 and an upper dam layer 24. The bond shelves have a plurality of bond fingers 26. Most of the bond fingers 26 are connected to the external pins 12 by internal routing (not shown) within the package 10. The bond fingers 26 on the second 20 and third 22 shelves are typically dedicated to electrical signals. The first shelf 18 typically has a pair of conductive busses 28 that are dedicated to power (Vcc) and ground (Vss). The substrate 16 is preferably constructed with conventional printed circuit board process, although it is to be understood that the substrate 16 can be constructed with other packaging materials and processes such as co-fired ceramic.

An integrated circuit 32 is mounted to the heat slug 14. The integrated circuit 32 has a plurality of die pads 34 located about the periphery of the die 32. The die pads 34 are connected to the bond fingers 26 by bond wires 36. The integrated circuit 32 is preferably a microprocessor, although it is to be understood that the integrated circuit may be any electrical device.

One corner of the second bonding shelf 20 has a pair of discrete components 38 and 40 mounted to surface pads 42 formed in the package 10. The components 38 and 40 are preferably located within a recess 44 in the bond shelves. The recess 44 accommodates the inclusion of the components without increasing the height of the package 10. The recess 44 preferably extends into the third shelf 22 to provide enough space for the discrete components 38 and 40. The recess 44 is preferably wide enough to prevent solder resist or prepreg from flowing onto the surface pads 42 during the lamination process of the printed circuit board 16.

The surface pads 42 are connected to three bond fingers 26 located on the second shelf 20 by three lead traces 46. The traces 46 terminate at the surface pads 42 and are not routed to the external pins 12 so that the components cannot be electrically accessed through the pins 12. The package 10 may have test traces 48 that couple the surface pads 42 to the external pins 12 during the testing and development of the package 10. The test traces 48 can be removed or terminated at the edges of the production packages 10 that are sold to end users. The cavity of the package 10 is filled with an encapsulant 50 to enclose the integrated circuit 32 and components 38 and 40. The encapsulant 50 prevents physical access to the devices without damaging the package 10. The devices 38 and 40 can therefore not be accessed, removed, destroyed, or modified without damaging the package 10. The package 10 of the present invention therefore deters a third party from modifying and reselling the package 10.

In the preferred embodiment, the components are a resistor 38 and a capacitor 40. The resistor 38 and capacitor 40 are coupled to the integrated circuit 32 to define an RC time constant circuit which is used to control the operating frequency of the circuit 32. Although a resistor and a capacitor are shown and described, it is to be understood that the components may be any electrical device such as a crystal oscillator, or a ceramic resonator.

The package 10 is typically assembled by initially constructing the printed circuit board 16 using conventional circuit board techniques. The recess 44 can be formed by routing out the dielectric layer(s) in the circuit board before lamination. The discrete components 38 and 40 are then mounted to the surface pads 42. The components can be mounted using reflowed solder paste, a metal filled adhesive, or any other means to mount the devices 38 and 40.

The heat slug 14 is attached to the substrate 16 and the integrated circuit 32 is then mounted to the heat slug 14. The integrated circuit 32 is wire bonded to the bond fingers 26 and enclosed with the encapsulant 50. The pins 12 are then attached to the substrate 16 to complete the package 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a package which has a plurality of bond fingers that are located on a plurality of bond shelves, said package further having a plurality of external contacts and a plurality of surface pads located within a recess of said bond shelves;

an electrical device that is mounted to said surface pads; and, a pair of lead traces that extend from said bond fingers and terminate at said surface pads, wherein said electrical device and said lead traces are enclosed by said package and cannot be accessed through said external contacts.

2. The package as recited in claim 1, wherein said electrical device is located within a recess in said package.

3. The package as recited in claim 2, wherein said electrical device is a capacitor.

4. The package as recited in claim 2, wherein said electrical device is a resistor.

5. An electronic package, comprising:

a package which has a plurality of bond fingers that are located on a plurality of bond shelves, said package further having a plurality of external contacts and a plurality of surface pads located within a recess of said bond shelves;

an electrical device that is mounted to said surface pads;

a pair of lead traces that extend from said bond fingers and terminate at said surface pads; and, an integrated circuit that is mounted to said package and connected to said bond fingers, wherein said electrical device and said lead traces are enclosed by said package and cannot be accessed through said external contacts.

6. The package as recited in claim 5, wherein said electrical device is located within a recess in said package.

7. The package as recited in claim 5, wherein said electrical device is a capacitor.

8. The package as recited in claim 5, wherein said electrical device is a resistor.

* * * * *